United States Patent
Hiura et al.

(10) Patent No.: US 7,139,146 B2
(45) Date of Patent: Nov. 21, 2006

(54) SIGNAL PROCESSING APPARATUS AND METHOD, AND DIGITAL DATA REPRODUCING APPARATUS

(75) Inventors: Tomoyuki Hiura, Kanagawa (JP); Hiroyuki Ino, Tokyo (JP)

(73) Assignee: Sony Corporation, Tokyo (JP)

( * ) Notice: Subject to any disclaimer, the term of this patent is extended or adjusted under 35 U.S.C. 154(b) by 334 days.

(21) Appl. No.: 10/484,427

(22) PCT Filed: May 22, 2003

(86) PCT No.: PCT/JP03/06424

§ 371 (c)(1),
(2), (4) Date: Jan. 27, 2004

(87) PCT Pub. No.: WO03/100782

PCT Pub. Date: Dec. 4, 2003

(65) Prior Publication Data

US 2004/0169945 A1    Sep. 2, 2004

(30) Foreign Application Priority Data

May 28, 2002    (JP) .......................... P2002-154468

(51) Int. Cl.
*G11B 5/09* (2006.01)
(52) U.S. Cl. .......................................... 360/65; 360/39
(58) Field of Classification Search ..................... None
See application file for complete search history.

(56) References Cited

U.S. PATENT DOCUMENTS 4,110,798 A * 8/1978 Miller et al. .................. 360/65
5,450,253 A * 9/1995 Seki et al. .................... 360/65
5,706,267 A * 1/1998 Kimura et al. ............. 369/59.17
6,625,235 B1 * 9/2003 Coker et al. ................. 375/341
6,888,782 B1 * 5/2005 Tateishi et al. .......... 369/47.18

FOREIGN PATENT DOCUMENTS

| EP | 0 535 737 A2 * | 7/1993 |
| JP | 63-299403 | 12/1988 |
| JP | 4-362808 | 12/1992 |
| JP | 7-85598 | 3/1995 |
| JP | 7-104776 | 4/1995 |
| JP | 10-199146 | 7/1998 |

* cited by examiner

*Primary Examiner*—Andrea Wellington
*Assistant Examiner*—Varsha A. Kapadia
(74) *Attorney, Agent, or Firm*—Oblon, Spivak, McClelland, Maier & Neustadt, P.C.

(57) ABSTRACT

A replay signal, obtained on reproducing a recording medium, on which has been recorded a digital signal, is supplied to an input terminal (1), and quantized by an A/D converter (8). The so quantized signal is processed by an integrator (20), formed by a first order IIR filter, so as to be adjusted in gain by an amplifier (21). The quantized replay signal is also processed by a differentiator formed by a combination of a first order FIR filter (22) and a first order IIR filter (23) so as to be then adjusted in gain by an amplifier (24). The resulting signal is then supplied to an adder (25) where it is subtracted from an output signal of the amplifier (21). In this manner, the differentiation/integration equalizer, formed by an analog circuit, is constructed by a digital circuit of a simplified configuration without raising the number of orders of the filters. The replay signal is processed by differentiation/integration such as to satisfy the equalization standard.

15 Claims, 14 Drawing Sheets

US 7,139,146 B2

SIGNAL PROCESSING APPARATUS AND METHOD, AND DIGITAL DATA REPRODUCING APPARATUS

TECHNICAL FIELD

This invention relates to a signal processing apparatus, a signal processing method and a digital data reproducing apparatus. For example, this invention relates to a signal processing apparatus and a signal processing method, used for waveform equalization in recording and/or reproduction of digital data, and to a digital data reproducing apparatus.

This application claims priority of Japanese Patent Application No. 2002-154468, filed in Japan on May 28, 2002, the entirety of which is incorporated by reference herein.

BACKGROUND ART

In a digital data recording and/or reproducing apparatus, partial response (PR) is exploited in recording symbols in order to suppress inter-symbol interference. The PR means an equalization system in which the inter-symbol interference is positively applied to the waveform to achieve efficient transmission. Recently, this PR is frequently used in a so-called PRML (partial response maximum likelihood) signal processing system in which a pre-correlated data sequence is combined with the viterbi decoding system in which the maximum likelihood sequence is selected and reproduced. There are several types of the PR, from which the PR matched to characteristics of the transimission channel in use or to characteristics of the recording and/or reproducing system in use is selected.

Among these PR types, the response characteristics of the PR1(=PR(1, 1)) and PR2(=PR(1, 2, 1)) are represented as (1+D) and (1+2·D+D·D), where D is a unit delay or one-sample delay. With the PR1 and PR2, if it is attempted to effect equalization so as to satisfy the Nyquist standard, the characteristics achieved are the low range emphasizing characteristics. For example, in the frequency response of PR1, shown in FIG. 1, the replay signals are needed as from the DC components.

However, in a recording and/or reproducing apparatus, for example a magnetic recording apparatus, DC components are not transmitted, while low range loss is encountered due to use of a magnetic recording medium. For compensation, an integration equalizer is needed. In particular, compensation of the low range loss by the aforementioned integration equalization is critical in case of application to the PRML signal processing system, combined with the decoding of the ML system, especially in consideration of the importance in raising the waveform reproducibility.

Heretofore, such a circuit structure, shown in FIG. 2, has been known as a signal processing circuit, inclusive of an integration equalizer, implemented as an analog circuit. Referring to FIG. 2, a replay signal, supplied to an input terminal 101, has its low range components equalized by integration with an integrator 102 formed by an LPF (low-pass filter), and the amplitude of the integrated replay signal is adjusted by an amplifier 103. Since the high range components, resulting from processing by the integrator configuration, undergo phase distortion, the replay signal, supplied from the input terminal 101, are sent to a differentiator 104, formed by a HPF (high-pass filter), for compensating the phase of the high range components. The amplitude of the differentiated replay signal is adjusted by an amplifier 105. An output signal from the amplifier 105 is supplied to an adder 106 where it is subtracted from the replay signal sent from the integrator 102 through the amplifier 103. It is noted that the amplifiers 103, 105 adjust the signal gain into matching with the equalization standard for the integrator side frequency and for the differentiator side frequency, respectively. This type of the integration equalizer is termed a differentiation/integration equalizer. An output from the adder 106 is sent through an anti-aliasing LPF (low-pass filter) 107 to an A/D converter (analog-to-digital converter) 108 and quantized. The quantized signal is PR-equalized by an adaptive equalizing filter 109 and taken out at an output terminal 110. In the circuit of FIG. 2, the portions encircled by a broken line (integrator 102, differentiator 104, amplifiers 103, 105, adder 106 and LPF 107) are formed by analog circuits.

The above-described circuit operates as follows: It is assumed that a NRZ (non-return-to-zero) signal pattern, shown in FIG. 3, has been recorded on a recording medium by a recording and/or reproducing apparatus. The replay signal from the recording and/or reproducing apparatus at this time is as shown in FIG. 4 and is supplied to the input terminal 101 of FIG. 2. The replay signal has its low range components extracted by the integrator 102 of FIG. 2, and an integrated output shown in FIG. 5 is obtained. The signal output from the integrator 102 is amplified by the amplifier 103 into meeting with the equalization standard for this frequency. On the other hand, the replay signal, supplied to the input terminal 101, has its high range components extracted by the differentiator 104, and a differentiated output shown in FIG. 6 is obtained. The signal output from the differentiator 104 is amplified by the amplifier 105 into meeting with the equalization standard for this frequency. The replay signal, equalized for each frequency, is supplied to the adder 106 of FIG. 2 where the replay signal sent through the differentiator 104 and the amplifier 105 is subtracted from the replay signal sent through the integrator 102 and the amplifier 103. The resulting replay signal is shown in FIG. 7. After rough equalization by the differentiation/integration equalizer, the replay signal is quantized by the A/D converter 108 of FIG. 2 and processed by the adaptive equalization filter 109 with equalization to higher accuracy.

If the case of the PR1 is taken as an example, the frequency response is as shown in FIG. 1. If, in a system with low range cut-off characteristics, such as a magnetic recording and/or reproducing apparatus, the replay signal is to be equalized to the corresponding equalization standard, the DC component is not reproduced. Thus, in order to provide a sufficient S/N ratio, the gain of the amplifier 103 on the output side of the integrator 102 of FIG. 2 is significant. If such analog circuit is to be implemented as an LSI, a large operating range needs to be provided, so that the driving current for the circuit is correspondingly increased to render it difficult to lower the voltage or power consumption.

DISCLOSURE OF THE INVENTION

In view of the above-described status of the art, it is an object of the present invention to provide a signal processing apparatus, a signal processing method and a digital data reproducing apparatus, in which the differentiation/integration equalizer, so far built as an analog circuit, is built as a digital circuit and in which the desired equalization may be achieved by a simplified structure without increasing the number of orders of the filters.

In one aspect, the present invention provides a signal processing apparatus and method including an A/D converting means/step of converting a signal obtained on reproducing a recording medium into a digital signal, an integration equalizing means/step of equalizing low range components of an output signal from the A/D converting means/step by an integrator having a first order IIR filter configuration, a differentiating equalizing means/step of equalizing high range components of an output signal from the A/D converting means/step by a differentiator at least having a first order FIR filter configuration, a subtracting means/step of subtracting an output signal from the differentiating equalizing means/step from an output signal from the integration equalizing means/step, and an adaptive equalizing means/step of supplying an output signal from the subtracting means/step to an adaptive equalizing filter for adaptive equalization.

In another aspect, the present invention provides a digital data reproducing apparatus, comprising reproducing means for reproducing a digital signal recorded on a recording medium, amplifier means for amplifying a signal from the reproducing means, A/D converting means for converting a signal from the amplifier means into a digital signal, an integrator having a first order IIR filter configuration for equalizing low range components of an output signal from the A/D converting means, a differentiator at least having a first order FIR filter configuration for equalizing high range components of an output signal from the A/D converting means, an adder for subtracting an output signal of the differentiator from an output signal of the integrator, an adaptive equalizing filter supplied with an output signal of the adder, and maximum likelihood means for performing maximum likelihood on an output signal from the adaptive equalizing filter.

The IIR filter of the integrator has a transfer function $H_0(z)$ of $$H_0(z)=1/(\alpha \cdot (1+\beta \cdot z^{-1}))$$

where $\alpha=1/(\omega_0 \cdot T_s)$ $\beta=-\exp(-\omega_0 \cdot T_s)$ $\omega_0$ is a cut-off frequency; and $T_s$ is a sampling frequency. The differentiator has a transfer function $H_1(z)$ of $$H_1(z)=\gamma \cdot (1-z^{-1})/(1+\epsilon \cdot z^{-1})$$

where $\gamma=(2/T_s)/(\omega_1+2/T_s)$ $\epsilon=(\omega_1-2/T_s)/(\omega_1+2/T_s)$ and $\omega_1$ is a cut-off frequency.

BEST MODE FOR CARRYING OUT THE INVENTION

Figure 1:
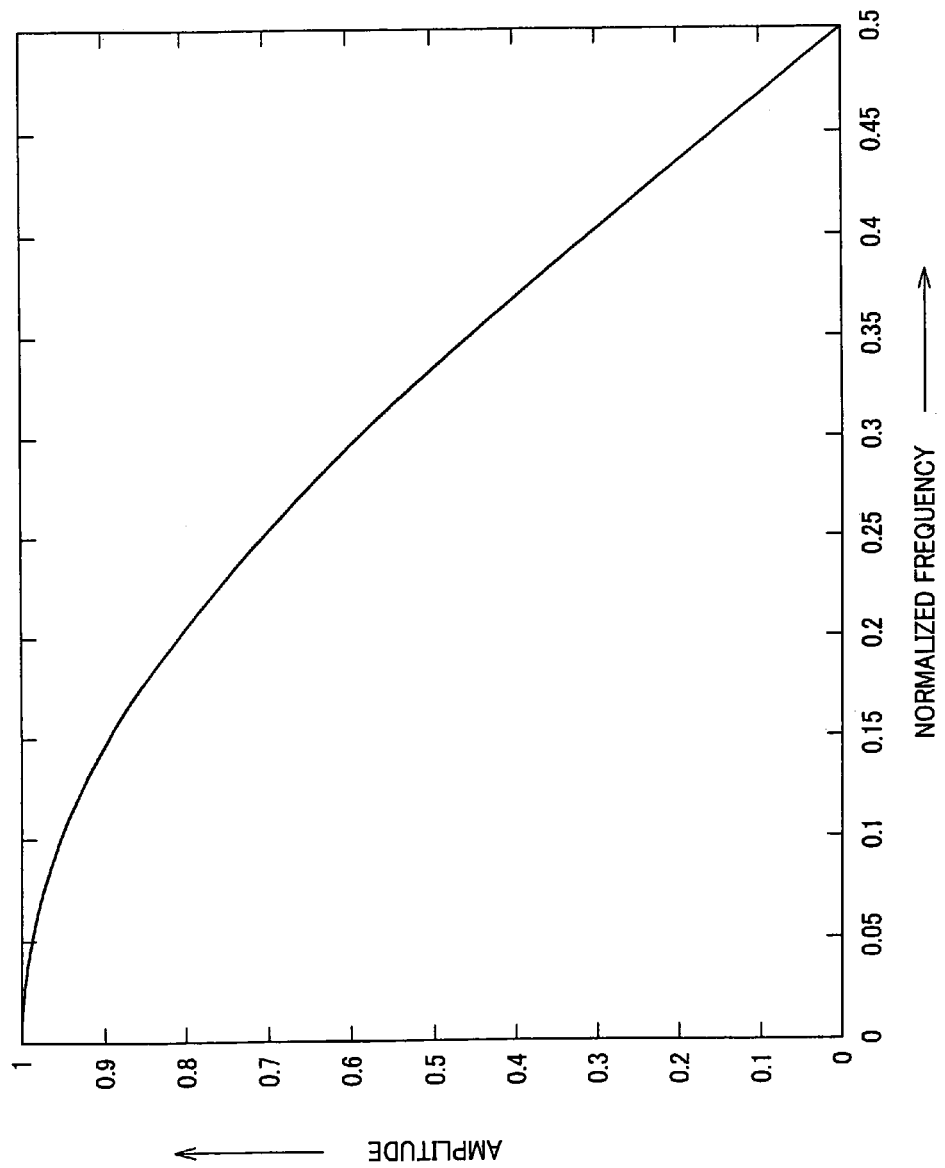
FIG. 1 is a graph showing frequency response of PR (partial response) 1.

Referring to the drawings, certain specified embodiments of the signal processing apparatus and method and the digital data reproducing apparatus of the present invention are explained in detail.

Considering a digital data recording and/or reproducing apparatus, employing the signal recording and/or reproducing method and apparatus according to the present invention, when the signal obtained on reproduction of a recording medium, having recorded digital signals, are returned to the original bi-level digital signals, the signals are equalized, prior to discrimination, so as to satisfy the equalization standard. In the case of recording symbols in need of integration detection, as in PR1, a differentiation/integration equalizer is needed.

Thus, in the present embodiment, in order to implement this differentiation/integration equalizer by a digital circuit, the replay signal obtained on quantization (A/D conversion) of the analog replay signal from the recording medium and passed through a differentiator comprised of a combination of a first order FIR (finite impulse response) filter and a first order IIR (infinite impulse response) filter so as to be then adjusted in gain is subtracted from the replay signal obtained on quantization (A/D conversion) of the analog replay signal from the recording medium and passed through an integrator formed by a first order IIR (infinite impulse response) filter so as to be then adjusted in gain. In the IIR (infinite impulse response) filter configuration, the input signal is added to a product of an output signal one sampling period before and the input signal. On the other hand, multiplication of the output signal and the coefficient in the filter circuit may be made by bit shift subject to the use of multiples of 2 as coefficient, such that the multiplier with attendant voluminous processing operations may be eliminated. In actuality, the multiplication may be implemented by a one-stage adder.

Figure 8:
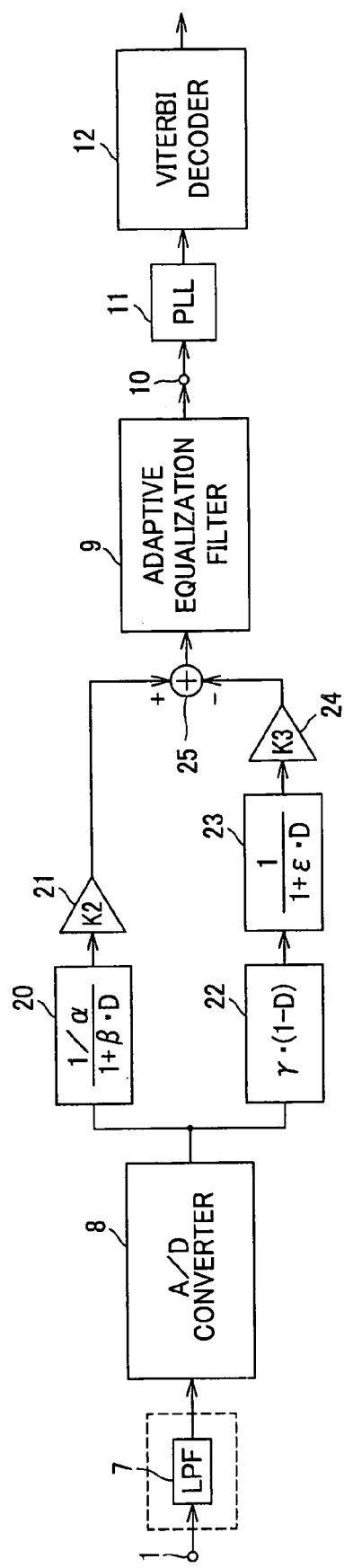
FIG. 8 is a block diagram showing a schematic structure of a signal processing apparatus embodying the present invention.

FIG. 8 is a block diagram showing an illustrative structure of a signal processing apparatus used as an equalizer for a digital data recording and/or reproducing apparatus, as embodiments of the signal processing method and apparatus according to the present invention. The signal processing apparatus, shown in FIG. 8, is made up by an anti-aliasing LPF (low-pass filter) 7 for an input signal from an input terminal 1, an A/D converter (analog-to-digital converter) 8 for quantizing an output signal from the LPF 7, an integrator (IIR filter) 20 for equalizing low-range components of the quantized replay signal, an amplifier 21 for adjusting the amplitude of the integrated replay signal, a differentiator (FIR filter 22 and IIR filter 23) for equalizing the high-range component of the quantized replay signal, an amplifier 24 for adjusting the amplitude of the differentiated replay signal, an adder 25 for subtracting the differentiated replay signal form the integrated replay signal, and an adaptive equalizing filter 9 for PR (partial response) equalization.

Referring to FIG. 8, in order to prevent the anti-aliasing noise from being produced on quantization of the replay signal, supplied to the input terminal 1, the replay signal is passed through the anti-aliasing LPF 7. The replay signal then is quantized by the A/D converter (analog-to-digital converter) 8. The quantized replay signal is then equalized, into keeping up with the standard for equalization, for each of the low-range and high-range frequencies. For low-range equalization, the quantized replay signal is supplied to the integrator 20, formed by the IIR filter, to extract only the low-range component, which then is amplified into keeping with the equalization standard by the amplifier 21. For high-range equalization, the quantized replay signal is supplied to a differentiator made up by the FIR filter 22 and the IIR filter 23 to extract only the high-range components which is then amplified into keeping with the equalization standard by the amplifier 24. As in the conventional technique, shown in FIG. 2, the equalized high-range replay signal, from the differentiator is subtracted in the adder 25 from the equalized low-range replay signal from the integrator. The replay signal from this operation process is supplied to an adaptive equalization filter 9 for ultimate PR equalization. This PR equalized replay signal is output from an output terminal 10. An output signal from the output terminal 10 is sent to a PLL (phase locked loop) circuit 11 for clock extraction and thence supplied to a viterbi decoding circuit 12 for viterbi decoding.

The integrator (IIR filter) 20 and the differentiator (FIR filter 22 and the IIR filter 23) are hereinafter explained.

Figure 2:
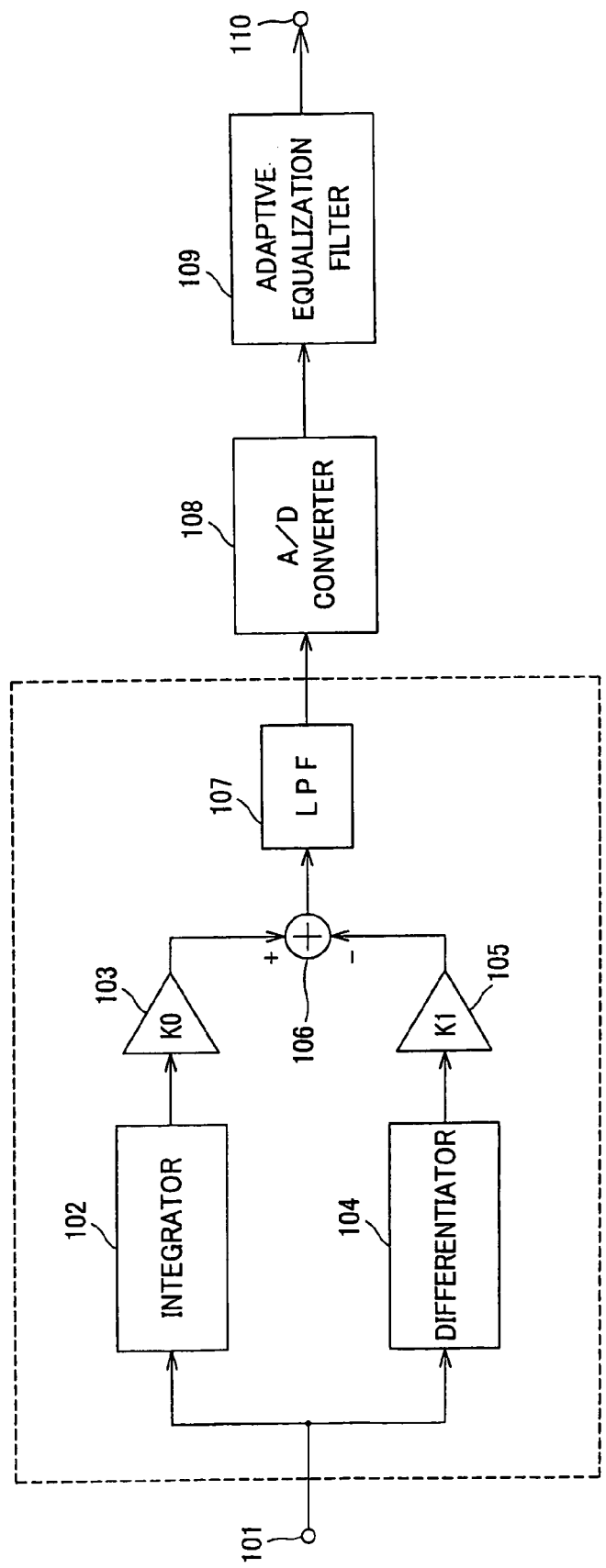
FIG. 2 is a block diagram showing an example of a signal processing circuit including an integrator equalizer by a conventional analog circuit.
Figure 3:
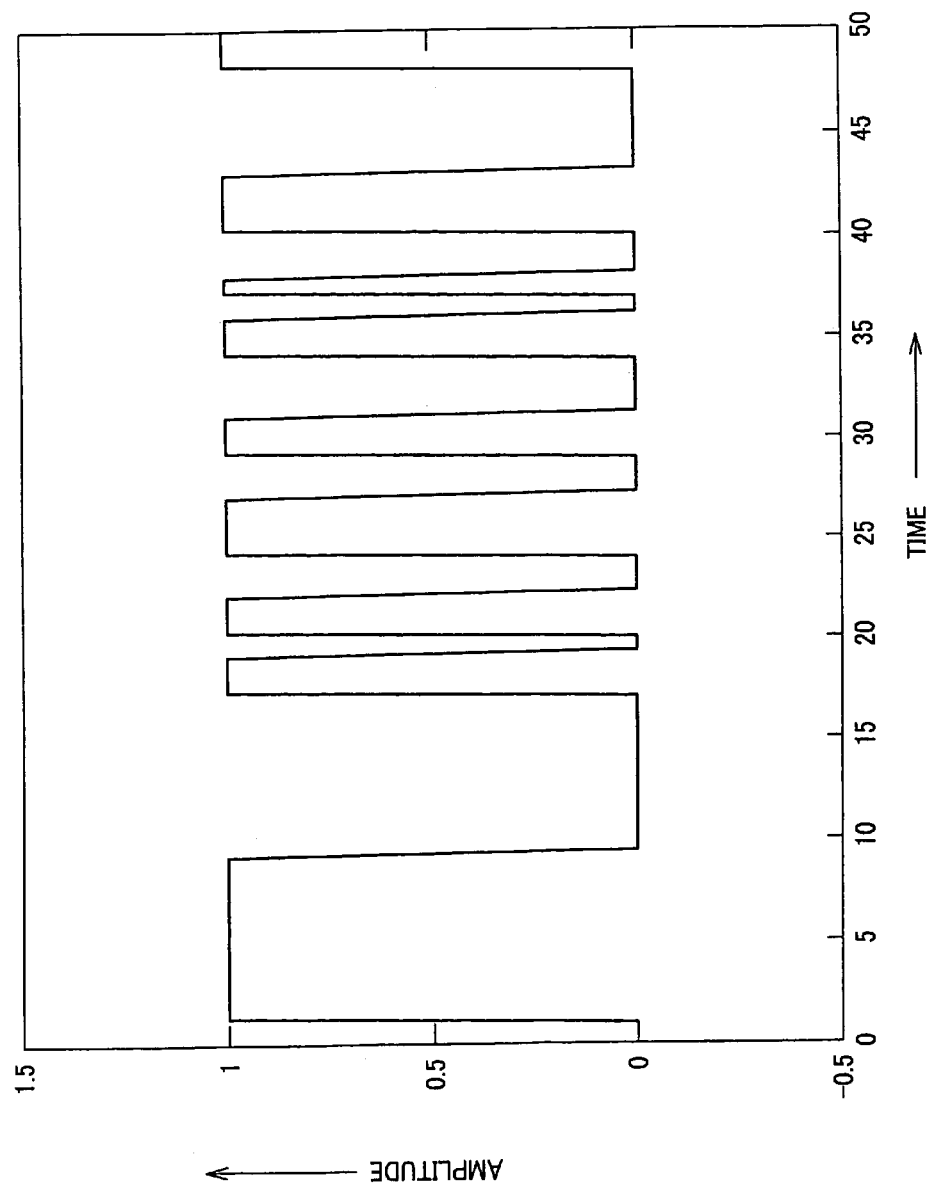
FIG. 3 shows a typical recording signal waveform for explaining the operation of the circuit of FIG. 2.
Figure 4:
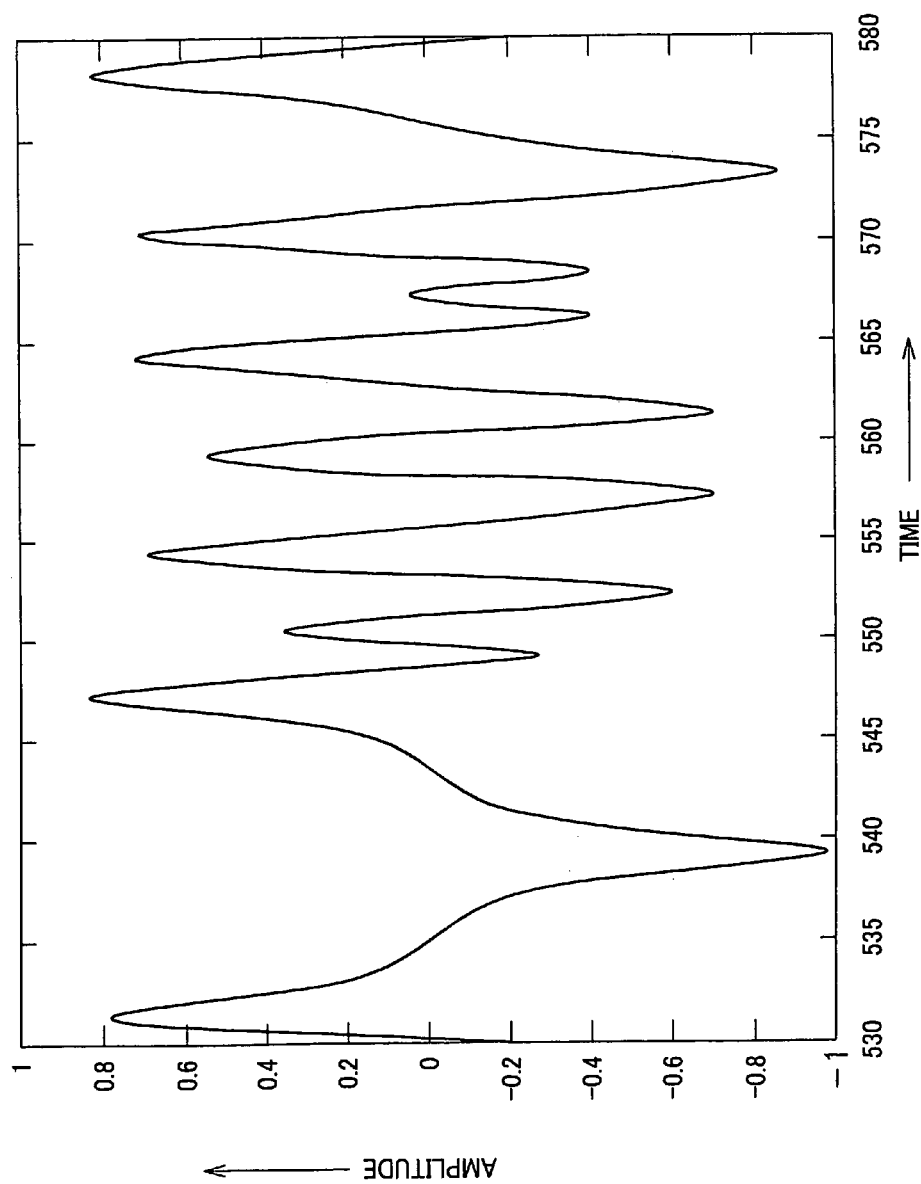
FIG. 4 shows a typical reproducing signal waveform for explaining the operation of the circuit of FIG. 2.
Figure 5:
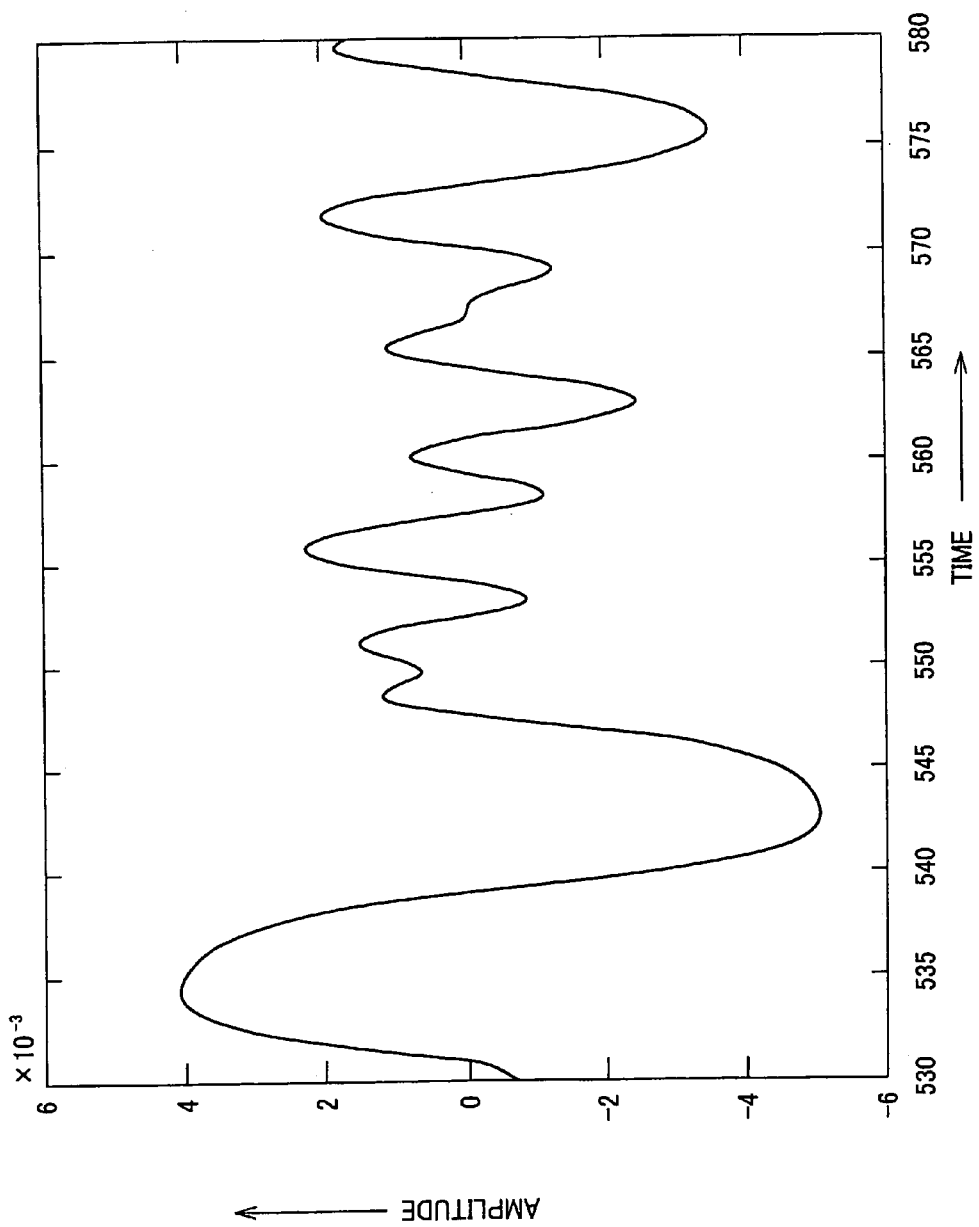
FIG. 5 shows a typical integrated output waveform for explaining the operation of the circuit of FIG. 2.
Figure 6:
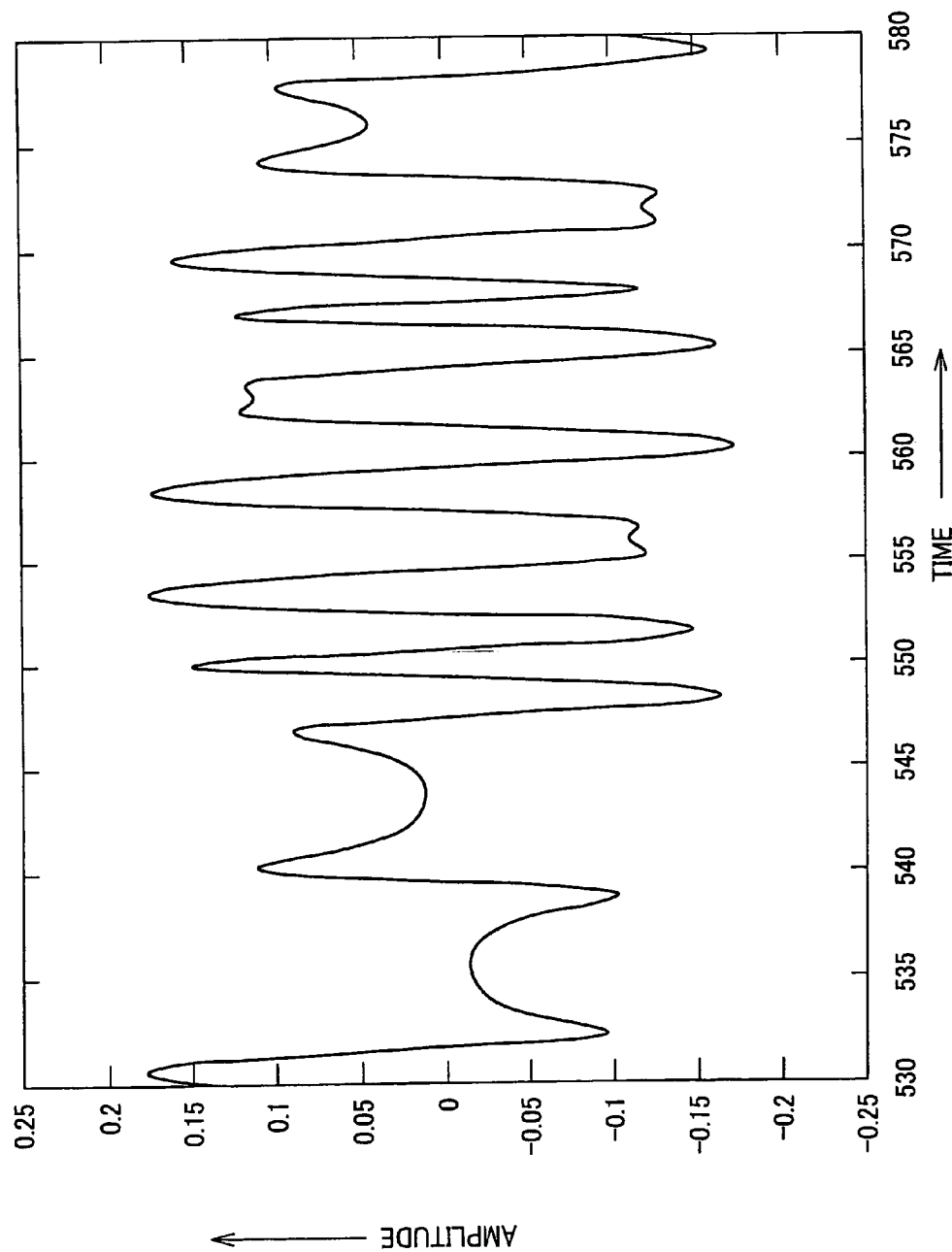
FIG. 6 shows a typical differentiated output waveform for explaining the operation of the circuit of FIG. 2.
Figure 7:
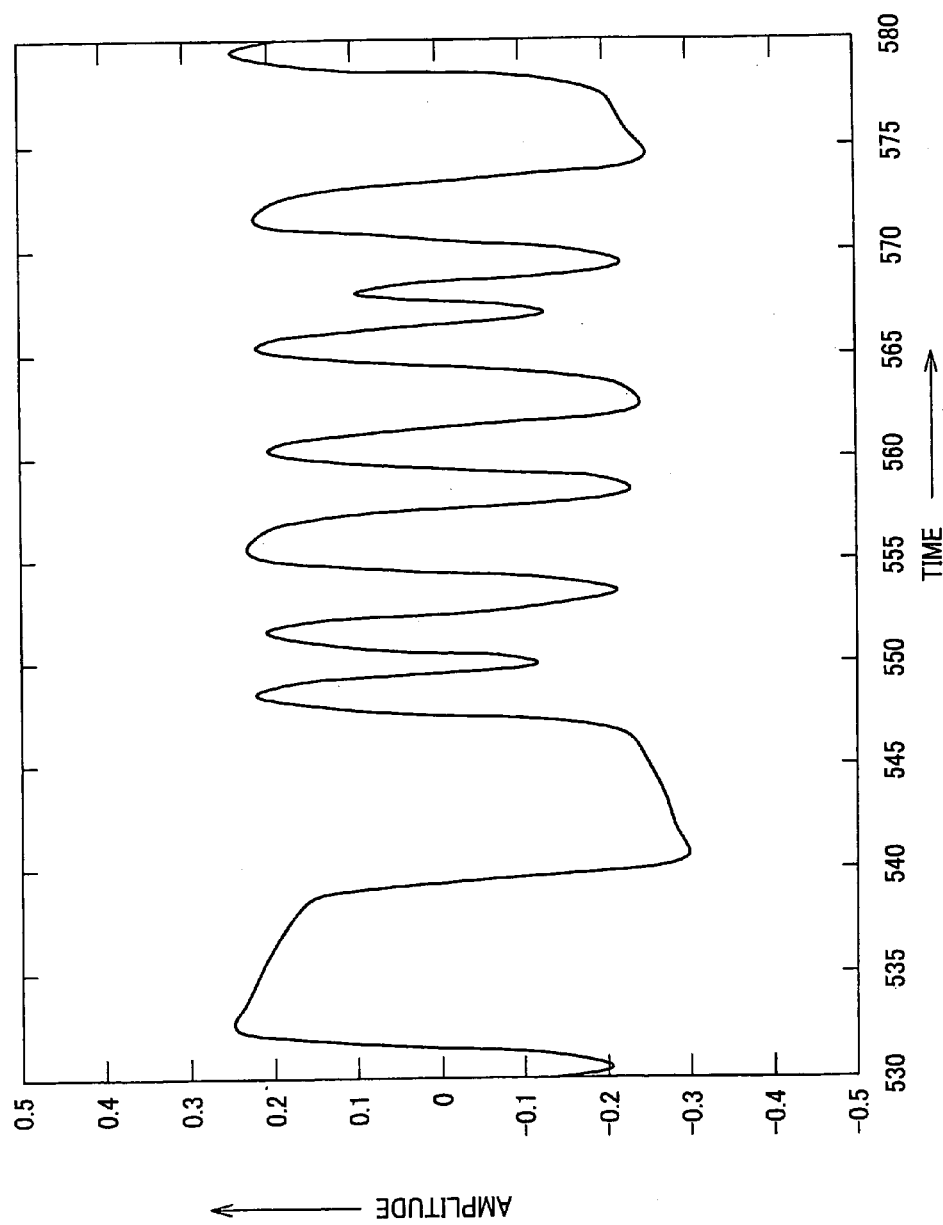
FIG. 7 shows a typical differentiation/integration equalizer output waveform for explaining the operation of the circuit of FIG. 2.

The conventional integrator 102, shown in FIG. 2, is formed by a first order low-pass filter, and has a transfer function Ho(s) which is represented by $$H_0(s)=\omega_0/(s+\omega_0) \quad (1).$$

The cut-off frequency $\omega_0$ is of a value sufficiently smaller than the sampling frequency (not larger than 1/100) by way of bandwidth limitation. Thus, if the impulse non-variation method is used for conversion from the s-plane into a z-plane of the discrete system, the integrator (IIR filter) 20 of FIG. 8 may be represented by $$H_0(z)=1/(\alpha \cdot (1+\beta \cdot z^{-1})) \quad (2)$$

where $\alpha$ and $\beta$ are $$\alpha=1/(\omega_0 \cdot T_s) \quad (3)$$

$$\beta=-\exp(-\omega_0 \cdot T_s) \quad (4)$$

where Ts is the sampling frequency. Meanwhile, the transfer function of the integrator 20 is represented by $(1/\alpha)/(1+\beta \cdot D)$, using a delay operator D (unit delay). The gain of the amplifier 21 (multiplication coefficient) is represented by K2.

The differentiator 104 of FIG. 2 is formed by an HPF (high-pass filter). The transfer function $H_1(s)$ of this differentiator 104 is represented as $$H_1(s)=s/(s+\omega_1) \quad (5).$$

Since bandwidth limitation is not made, an error may be increased if the impulse non-variation method is used for conversion from s-plane to z-plane for the discrete system, as in the case of the integrator. Thus, a bilinear conversion method is used. That is, by substituting $$s=(2/T_s) \cdot (1+z^{-1})/(1+z^{-1}) \quad (6)$$

into the above equation (5), the transfer function $H_1(z)$ of the FIR filter 22 and the IIR filter 23 of FIG. 8 may be represented by $$H_1(z)=\gamma \cdot (1-z^{-1})/(1+\epsilon \cdot z^{-1}) \quad (7)$$

where $\gamma$ and $\epsilon$ are given by $$\gamma=(2/T_s)/(\omega_1+2/T_s) \quad (8)$$

and $$\epsilon=(\omega_1-2/T_s)/(\omega_1+2/T_s) \quad (9).$$

In the embodiment shown in FIG. 8, the transfer characteristics of the FIR filter 22 and the IIR filter 23, making up the differentiator, are represented by $\gamma \cdot (1-D)$ and $1/(1+\epsilon \cdot D)$, using the unit delay (one-sample delay) D, respectively. The gain of the amplifier 24 (multiplication coefficient) is represented by K3. It is noted that, if the sampling frequency is low, as when it is of the same order of magnitude as the data rate of the recording data, only the FIR filter 22 of the characteristics of $\epsilon \cdot (1-D)$ suffices, meaning that a simplified structure may be used. However, if the sampling frequency is not less than twice the data rate, the IIR filter 23 with the characteristics of $1/(1+\epsilon-D)$ is also needed in order to achieve a higher approximation.

The cut-off frequency $\omega_1$ of the high-pass filter, operating as a differentiator, is taken in the vicinity of the data rate of the recording symbols. If the sampling frequency in quantizing the analog replay signal is not twice or more of the data rate of the recording symbols, it is sufficient if the operation is possible up to the frequency of (data rate)/2, without employing the bilinear converting method, provided that the frequency response is PR (partial response). In this case, the transfer function $H_1(z)$ of $$H_1(z)=1-z^{-1} \quad (10)$$

is sufficient.

Figure 9:
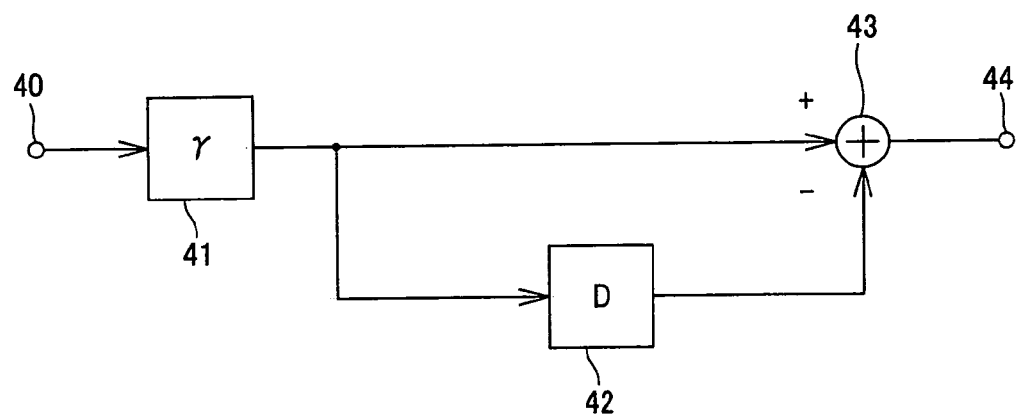
FIG. 9 is a block diagram showing a schematic structure of a typical first order FIR filter used in an embodiment of the present invention.

The structure of the FIR (finite impulse response) filter 22, used in the illustrative structure of the embodiment of the present invention, shown in FIG. 8, is shown in FIG. 9. In the case of the IIR (infinite impulse response) filter (filter 20 or 23), addition of an output signal one sampling time before, multiplied by the coefficient ($\beta$ of the equation (2) or $\epsilon$ of the equation (7)) to the input signal, must be carried out within one sampling time. A specified illustrative structure of the IIR filter, used in the embodiment of the performing in order to achieve this, is shown in FIG. 10.

Referring to FIG. 9, a signal supplied to an input terminal 40 is sent to a coefficient multiplier 41 where the signal is multiplied with the coefficient $\gamma$ and the resulting signal is sent to an adder 43 and a delay unit 42. An output signal from the delay unit 42 is sent to the adder 43 where it is subtracted from an output of the coefficient multiplier 41.

The resulting signal is taken out at an output terminal 44. By this stricture, the transfer characteristics of $\gamma \cdot (1-D)$ may be achieved.

Figure 10:
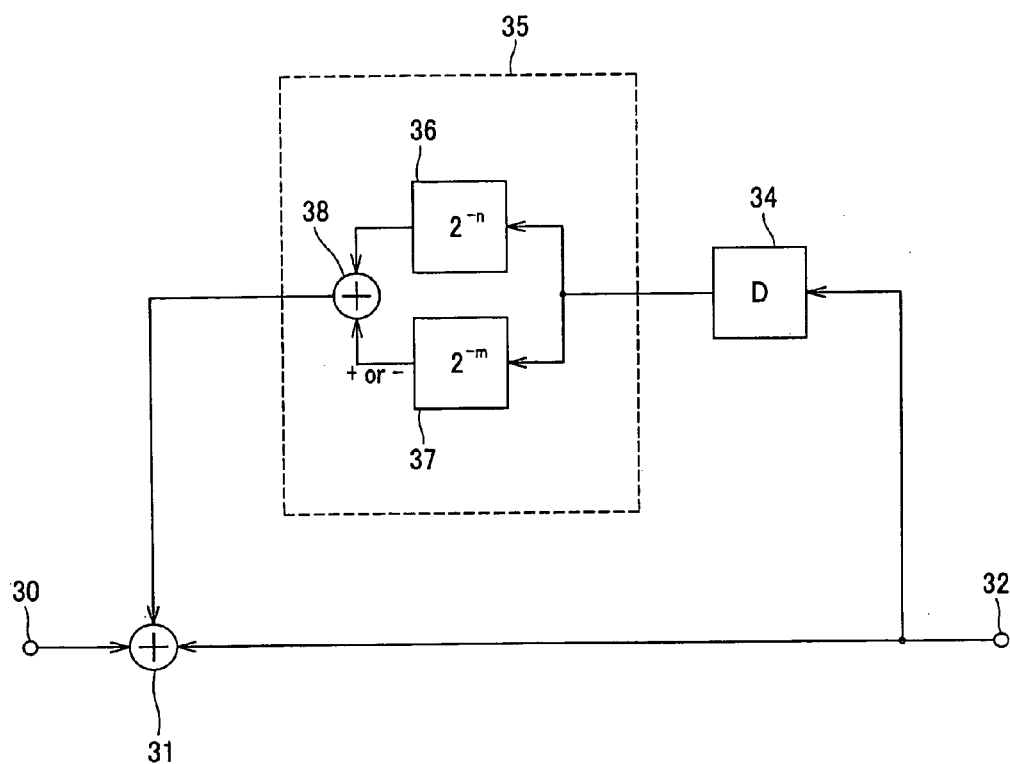
FIG. 10 is a block diagram showing a schematic structure of a typical first order IIR filter used in an embodiment of the present invention.

Then, referring to FIG. 10, a signal from an input terminal 30 is sent to an adder 31, an output signal of which is sent to a delay unit 34 and to an output terminal 32. An output signal from the delay unit 34 is multiplied by a coefficient multiplier 35 with a coefficient ($\beta$ or $\epsilon$) so as to be fed back to the input side adder 31. In the present embodiment, the structure may be simplified by selecting the coefficient of the coefficient multiplier 35 from a combination of multiples of 2, and by using a bit shifter and an adder, without using a routine multiplier with an attendant increased volume of processing operations. Specifically, in the case of FIG. 10, the output signal of the delay unit 34 is sent to two shift circuits 36, 37 in the coefficient multiplier 35, and output signals from the shift circuits 36, 37 are summed together by an adder. The shift circuits 36, 37 shift the input data by n and m bits towards right ($2^{-n}$, $2^{-m}$), respectively. These shift operations are not in need of gating circuits, and hence the processing operations may be carried out by a sole adder, thus enabling reduction of the number of the processing operations. The coefficient is determined by the combination of the shift quantities n, m (n, m=0, 1, 2, . . . ) of the respective shift registers.

Figure 11:
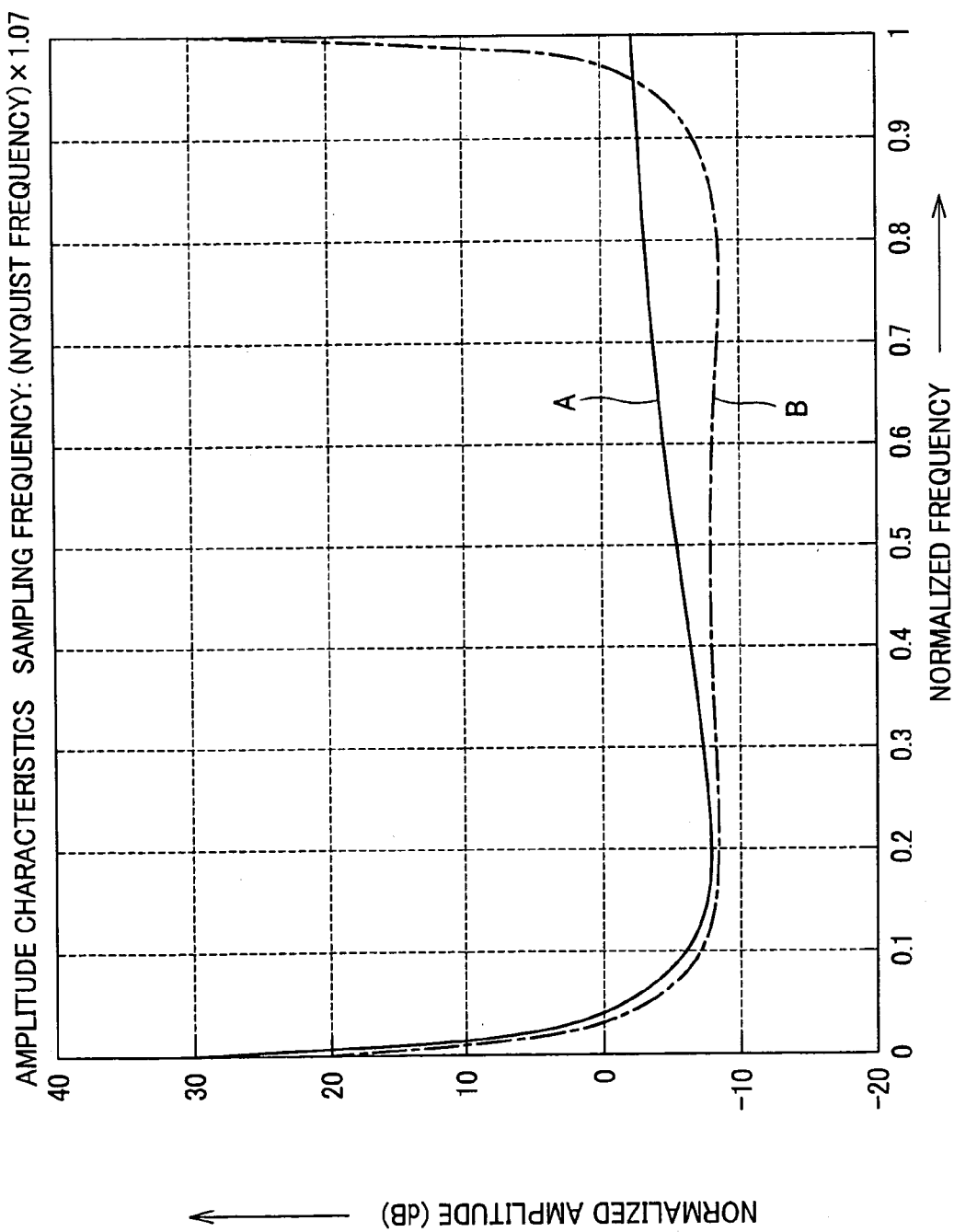
FIG. 11 is a graph showing frequency-amplitude characteristics of an embodiment of the present invention and a prior-art case.
Figure 12:
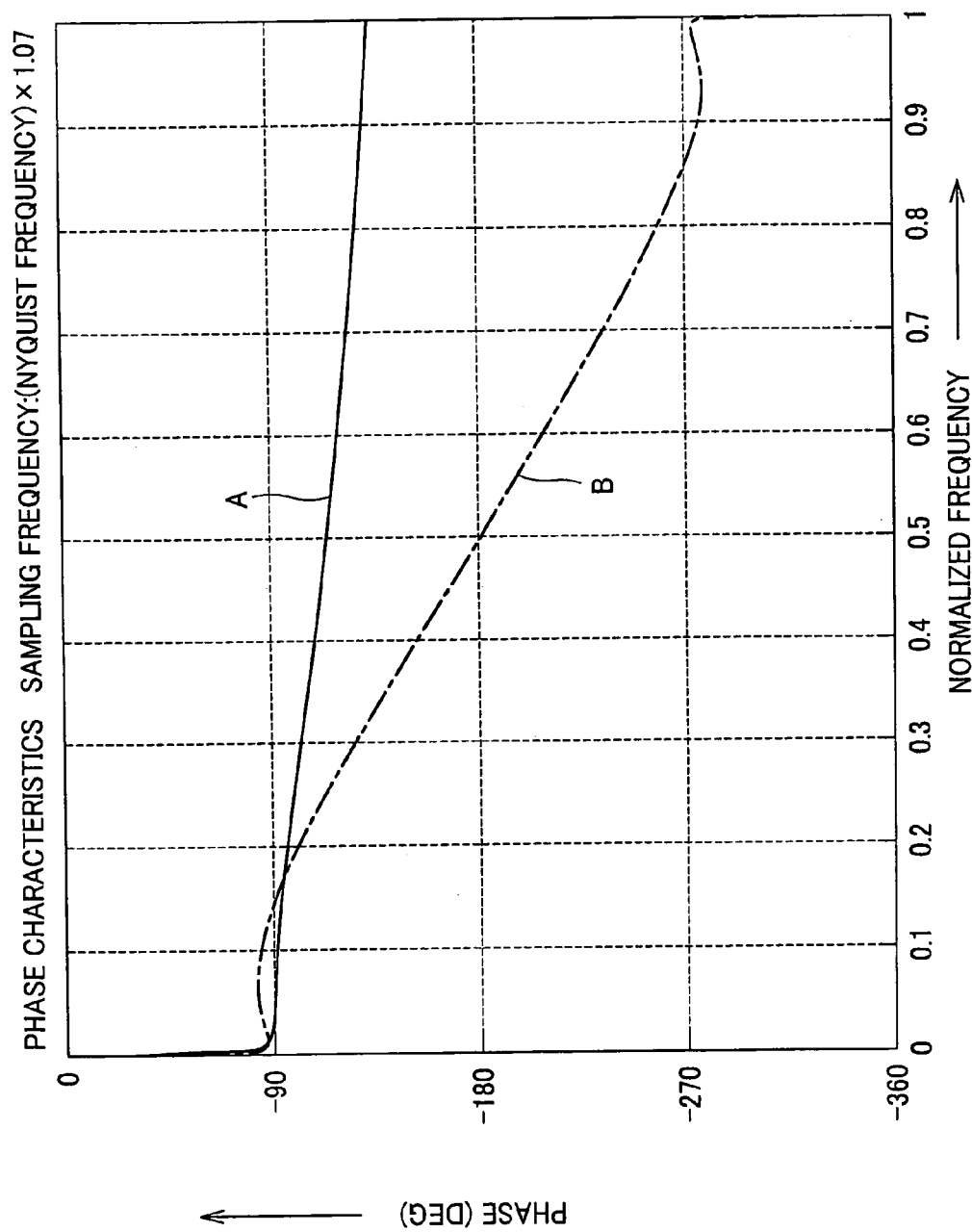
FIG. 12 is a graph showing frequency-phase characteristics of an embodiment of the present invention and a prior-art case.

FIGS. 11, 12 show specified examples of frequency response of the integration equalizer. Specifically, FIG. 11 shows amplitude characteristics and FIG. 12 shows phase characteristics. In FIGS. 11 and 12, a characteristic curve A stands for characteristics of a conventional analog circuit, shown in FIG. 2, while a characteristic curve B stands for frequency response of a differentiator/integrator, formed by a digital circuit, shown in FIG. 8, as in the present embodiment. As the frequency, plotted on the abscissa, the frequency normalized by the data rate is used. On the low frequency side and on the high frequency side, mainly the integration characteristics and differentiation characteristics are represented, respectively. These characteristics of FIGS. 11 and 12 are those for a case in which the sampling frequency is low and is approximately 1.07 times the data rate, that is, a case of not using the IIR filter 23 of the differentiator of FIG. 8, specifically, a case where the differentiator is formed solely by the FIR filter 22. As can be seen from FIGS. 11 and 12, it is possible to achieve amplitude characteristics of the same order as those achieved by the conventional analog circuit and to reduce phase distortion by a digital circuit of a simpler structure.

Figure 13:
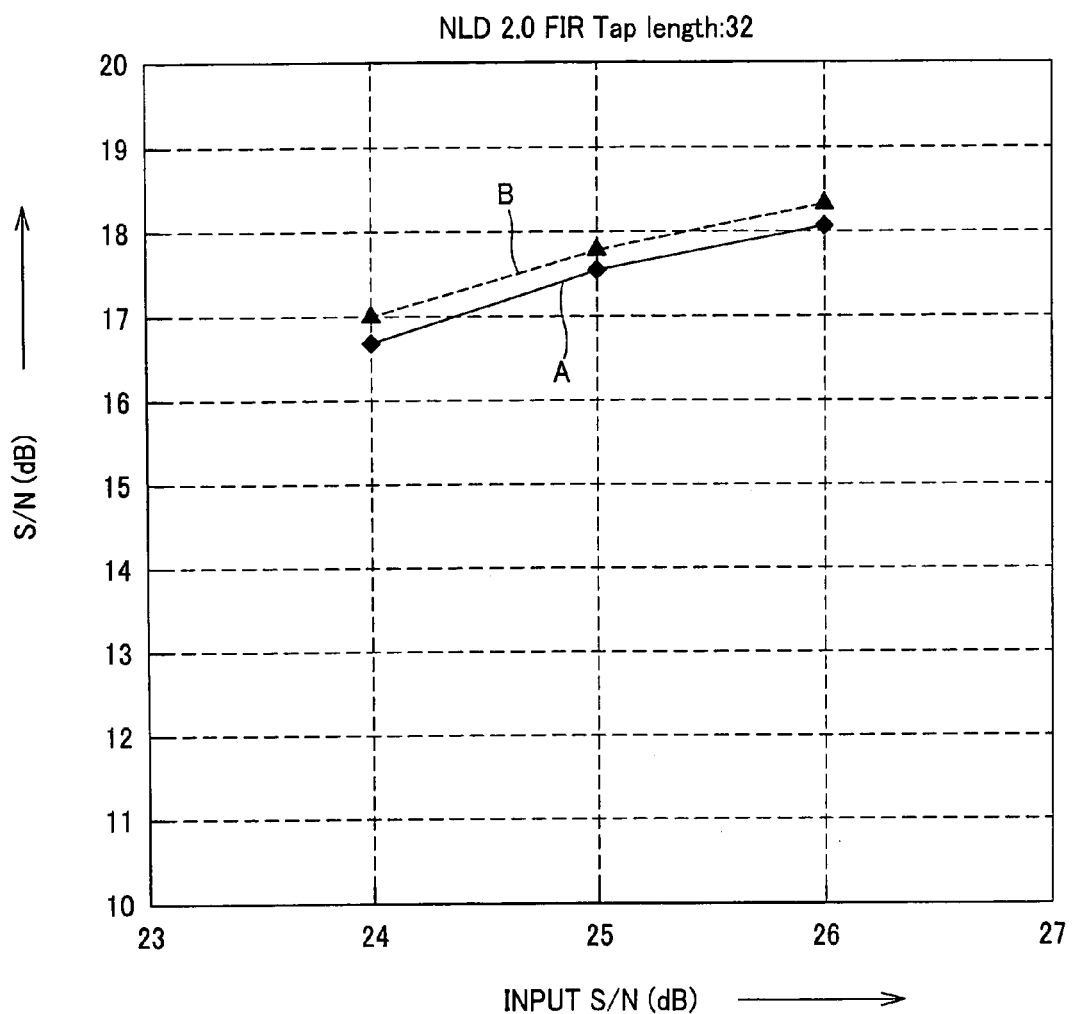
FIG. 13 is a graph showing S/N characteristics of an embodiment of the present invention and a prior-art case.

FIG. 13 shows S/N characteristics of the conventional structure (FIG. 2) and the present structure (FIG. 8). The S/N values for this case stand for outputs following adaptive equalization. Specifically, a characteristic curve A stands for an output from an adaptive equalization filter 109 of FIG. 2, whilst a characteristic curve B stands for an output from an adaptive equalization filter 9 of FIG. 8. The sampling frequency for the digital configuration is approximately 1.07 times the data rate of the recording symbols. Even though the sampling frequency is that low, the S/N ratio is improved over that of the conventional structure.

It is seen that the analog circuit in the structure of FIG. 8 is only the portion encircled by a broken line, that is the LPF 7 for anti-aliasing, and that the analog circuit portions encircled by a broken line of FIG. 2 (the integrator 102, differentiator 104, amplifiers 103, 1.05, adder 106 and the LPF 107) are implemented as digital circuits.

Thus, with the present embodiment, the conventional analog circuit can directly be digitized with the same number of orders of the filters as that in the conventional system. The signal operating range, given in the conventional analog circuit by the voltage, is now given, as a result of digitization, by bit widths, so that both the voltage and the power consumption may be reduced. Moreover, by exploiting the partial response (PR), equalization is possible even if the sampling frequency is lowered to approximately the data rate of the recording symbols. The differentiator type of the above equation (10) suffices, so that the high-range phase is changed to a linear phase with less phase distortion than in the conventional system.

Figure 14:
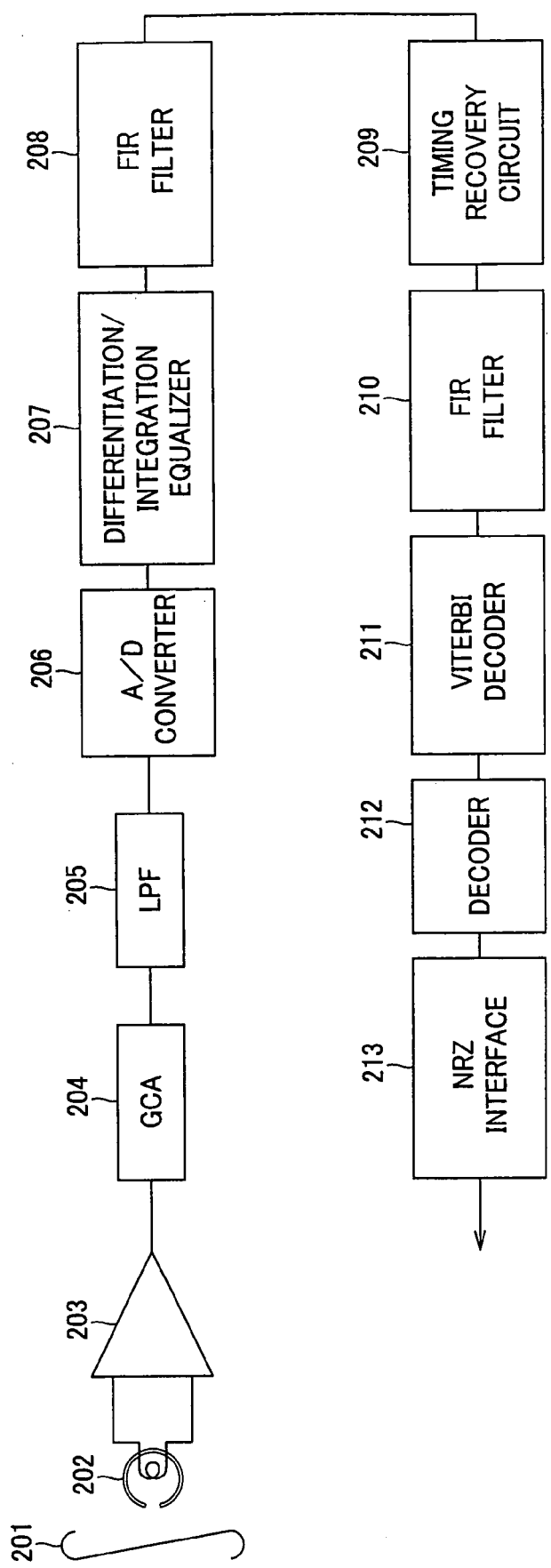
FIG. 14 is a block diagram showing a schematic structure of a digital data reproducing apparatus embodying the present invention.

Referring to FIG. 14, an embodiment of a digital data reproducing apparatus, exploiting the above-described signal processing apparatus and method according to the present invention, is now explained.

The digital data reproducing apparatus, shown in FIG. 14, is a magnetic recording and/or reproducing apparatus for recording and/or reproducing digital signals for a magnetic tape, such as a digital tape streamer. In FIG. 14, the digital signals, recorded on the magnetic tape 201, are reproduced by a magnetic head 202. The replay signals from the magnetic head 202 are of extremely small amplitude and hence are amplified by a pre-amplifier 203 to a moderate amplitude. The replay signals, output from the pre-amplifier 203, are sent to a gain control amplifier (GCA) 204 so as to be thereby amplified to a desired amplitude. As this gain control amplifier (GCA) 204, an auto gain control (AGC) amplifier, automatically amplifying the replay signals to a constant amplitude without regard to changes in the amplitude of the input signal, is frequently used. An output signal from the gain control amplifier (GCA) 204 is sent via an LPF (low-pass filter) 205 for anti-aliasing (for preventing aliasing noise) to an A/D converter 206 for quantization.

The replay signals, quantized by the A/D converter 206, are sent to a differentiation/integration equalizer 207 of the above-described embodiment of the present invention. This differentiation/integration equalizer 207 may be composed of an integrator (IIR filter) 20, for equalizing low frequency components of the quantized replay signal, an amplifier 21 for adjusting the amplitude of the integrated replay signal, a differentiator (FIR filter 22 and the IIR filter 23) for equalizing high frequency components of the quantized replay signal, an amplifier 24 for adjusting the differentiated amplitude and an adder 25 for subtracting the differentiated replay signal from the integrated replay signal, as shown for example in FIG. 8.

An output signal from the differentiation/integration equalizer 207 is provisionally equalized by an FIR (finite impulse response) filter 208, as an adaptive equalizing filter performing PR (partial response) equalization. The replay signal, provisionally equalized by the FIR filter 208, is synchronized with channel clocks by a timing recovery circuit 209 formed by a PLL (phase-locked loop) exploiting e.g. an interpolation filter. The synchronized replay signal is sent to an FIR filter 210 and equalized by this FIR filter 210 to high accuracy by exploiting an adaptive equalization algorithm. The so equalized signal is sent to a viterbi decoder 211 for maximum likelihood decoding. The bi-level signals, obtained on maximum likelihood decoding by the viterbi decoder 211, are processed in the decoder 212 with demodulation of the recording symbols (decoding) for conversion to NRZ symbols which are output via a NRZ interface 213. The resulting output signal is sent to e.g. an error correction circuit, not shown, for error correction processing.

The magnetic recording and/or reproducing apparatus, shown in FIG. 14, is assumed to be a digital tape streamer for recording and/or reproducing a magnetic tape. However, the present invention may, of course, be applied to a digital VTR, etc., to a magnetic disc apparatus employing a recording medium other than a tape or to a digital data recording and/or reproducing apparatus employing a recording medium other than a magnetic recording medium.

The present invention is not limited to the embodiments described with standard to the drawings and, as may be apparent to those skilled in the art, various changes, substitutions or equivalents may be envisaged without departing from the scope and the purport of the invention as defined in the appended claims.

INDUSTRIAL APPLICABILITY

According to the present invention, a signal obtained on reproducing a recording medium is converted into a digital signal, which is processed with A/D conversion to generate a digital signal. This digital signal has its low frequency components equalized on integration by an integrator having a first order IIR filter configuration, while having its high frequency components equalized on differentiation by a differentiator at least having a first order FIR filter configuration. The signal equalized on differentiation is subtracted from the signal equalized on integration. An output signal from subtraction is supplied to an adaptive equalization filter for adaptive equalization. The above-described configuration yields characteristics having approximately the same characteristics as those of the conventional analog circuit by a digital circuit having a simpler structure. The operating range may be given by bit width, as a result of digitalization, instead of by a voltage in case of the analog circuit, thus enabling the voltage and the power consumption to be reduced. By exploiting the partial response, equalization may be achieved even when the sampling frequency is lowered to approximately the data rate of the recording symbols. The differentiator may, in this case, be formed solely by an FIR filter. In the high frequency range, the phase is changed to a linear phase, while the phase distortion is lower than in the conventional system.

The invention claimed is:

1. A signal processing apparatus comprising
A/D converting means for converting a signal obtained on reproducing a recording medium into a digital signal;
an integrator having a first order IIR filter configuration equalizing low frequency components of an output signal from said A/D converting means;
a differentiator at least having a first order FIR filter configuration for equalizing high range components of the output signal from said A/D converting means;
a subtractor configured to subtract an output signal of said differentiator from an output signal of said integrator; and
an adaptive equalizing filter supplied with an output signal from said subtractor.

2. The signal processing apparatus according to claim 1, wherein said differentiator is composed of said FIR filter and an IIR filter connected thereto.

3. The signal processing apparatus according to claim 1, wherein the IIR filter of said integrator has a transfer function $H_0(z)$ of $$H_0(z)=1/(\alpha \cdot (1+\beta \cdot z^{-1}))$$

where $\alpha=1/(\omega_0 \cdot T_s)$ $$\beta=-\exp(1-\omega_0 \cdot T_s)$$

$\omega_0$ is a cut-off frequency; and $T_s$ is a sampling frequency, and wherein the differentiator has a transfer function $H_1(z)$ of $$H_1(z)=\gamma \cdot (1-z^{-1})/(1+\epsilon \cdot z^{-1})$$

where $\gamma=(2/T_s)/(\omega_1+2/T_s)$ $$\epsilon=(\omega_1-2/T_s)/(\omega_1+2/T_s)$$

and $\omega_1$ is a cut-off frequency.

4. The signal processing apparatus according to claim 1, further comprising;
a first amplifier configured to amplify an output signal of said integrator to maintain an equalization standard, and a second amplifier configured to amplify an output signal of said differentiator to maintain the equalization standard;
said subtractor subtracting an output signal of said second amplifier from an output signal of said first amplifier and outputting the resulting signal.

5. The signal processing apparatus according to claim 1, wherein a coefficient multiplier of a first order filter is used as said integrator and the differentiator is formed by shifting means for bit-shifting data and an adder means for summing the shifted data.

6. The signal processing apparatus according to claim 1, wherein said adaptive equalizing filter performs PR (partial response) equalization.

7. A signal processing method comprising
an A/D converting step of converting a signal obtained on reproducing a recording medium into a digital signal;
an integration equalizing step of equalizing low range components of an output signal from the A/D converting step by an integrator having a first order IIR filter configuration;
a differentiating equalizing step of equalizing high range components of an output signal from the A/D converting step by a differentiator at least having a first order FIR filter configuration;
a subtracting step of subtracting an output signal of said differentiating equalizing step from an output signal of said integration equalizing step; and
an adaptive equalizing step of supplying an output signal from said subtracting step to an adaptive equalizing filter for adaptive equalization.

8. The signal processing method according to claim 7, wherein the differentiator used in said differentiating equalizing step is an interconnection of said FIR filter configuration and an IIR filter configuration.

9. The signal processing method according to claim 7, wherein the IIR filter of said integrator used in said integration equalizing step has a transfer function $H_0(z)$ of $$H_0(z)=1/(\alpha \cdot (1+\beta \cdot z^{-1}))$$

where $\alpha=1/(\omega_0 \cdot T_s)$ $$\beta=-\exp(-\omega_0 \cdot T_s)$$

$\omega_0$ is a cut-off frequency; and $T_s$ is a sampling frequency, and wherein the differentiator has a transfer function $H_1(z)$ of $$H_1(z)=\gamma \cdot (1-z^{-1})/(1+\epsilon \cdot z^{-1})$$

where $\gamma=(2/T_s)/(\omega_1+2/T_s)$ $$\epsilon=(\omega_1-2/T_s)/(\omega_1+2/T_s)$$

and $\omega_1$ is a cut-off frequency.

10. The signal processing method according to claim 7, further comprising:

a first amplifying step of amplifying an output signal from said integration equalization step into keeping with an equalization standard, and a second amplifying step of amplifying an output signal of said differentiation equalization step into maintaining an equalization standard;

said subtracting step subtracting an output signal of said second amplifying step from an output signal of said first amplifying step and outputting the resulting signal.

11. The signal processing method according to claim 7, wherein a coefficient multiplier of a first order filter used as said integrator and the differentiator is formed by shifting means for bit-shifting data and an adder means for summing the shifted data.

12. The signal processing method according to claim 7 wherein said adaptive equalizing step performs PR (partial response) equalization.

13. A digital data reproducing apparatus, comprising reproducing means for reproducing a digital signal recorded on a recording medium;

amplifier means for amplifying a signal from said reproducing means;

A/D converting means for converting a signal from said amplifier means into a digital signal;

an integrator having a first order IIR filter configuration for equalizing low range components of an output signal from said A/D converting means;

a differentiator at least having a first order FIR filter configuration for equalizing high range components of an output signal from said A/D converting means;

a subtractor configured to subtract an output signal of said differentiator from an output signal of said integrator;

an adaptive equalizing filter supplied with an output signal of said subtractor; and maximum likelihood decoding means for performing maximum likelihood decoding on an output signal from said adaptive equalizing filter.

14. The digital data reproducing apparatus according to claim 13, wherein the differentiator is an interconnection of said FIR filter configuration and an IIR filter configuration.

15. The digital data reproducing apparatus according to claim 13, wherein the IIR filter of said integrator has a transfer function $H_0(z)$ of $$H_0(z)=1/(\alpha \cdot (1+\beta \cdot z^{-1}))$$

where $\alpha=1/(\omega_0 \cdot T_s)$ $$\beta=-\exp(-\omega_0 \cdot T_s)$$

$\omega_0$ is a cut-off frequency; and $T_s$ is a sampling frequency, and wherein the differentiator has a transfer function $H_1(z)$ of $$H_1(z)=\gamma \cdot (1-z^{-1})/(1+\epsilon \cdot z^{-1})$$

where $\gamma=(2/T_s)/(\omega_1+2/T_s)$ $$\epsilon=(\omega_1-2/T_s)/(\omega_1+2/T_s)$$

and $\omega_1$ is a cut-off frequency.

* * * * *